United States Patent [19]

Petersdorf

[11] 4,395,677
[45] Jul. 26, 1983

[54] HALL EFFECT TESTER FOR HEATED WINDOW GRIDS

[75] Inventor: Roland W. Petersdorf, Sterling Heights, Mich.

[73] Assignee: Chrysler Corporation, Highland Park, Mich.

[21] Appl. No.: 234,273

[22] Filed: Feb. 13, 1981

[51] Int. Cl.³ .................... G01R 33/00; G01R 31/08
[52] U.S. Cl. .................. 324/117 H; 324/52; 324/51
[58] Field of Search ............ 324/51, 52, 57, 66, 324/67, 117 H; 340/643, 652

[56] References Cited

U.S. PATENT DOCUMENTS 1,998,952 4/1935 Edgar .................... 324/117 H
3,617,865 11/1971 Hakata .................... 324/67 X
3,725,779 4/1973 Mauer .................... 324/51
3,885,212 5/1975 Herbert .................... 324/117 H
4,276,509 6/1981 Bryant .................... 324/52 X Primary Examiner—Stanley T. Krawczewicz
Assistant Examiner—Jose M. Solis
Attorney, Agent, or Firm—Newtson & Dundas

[57] ABSTRACT

An electronic tester for window grid heaters using a Hall Effect handheld probe device for use in detecting breaks in the grid lines. The instrument is intended for fabrication as an integrated circuit device to provide a low-cost unit which is advantageous for testing vehicles being mass produced. The device allows external electrical continuity testing of rear window heated grid systems obviating in-car testing on the assembly line.

3 Claims, 4 Drawing Figures

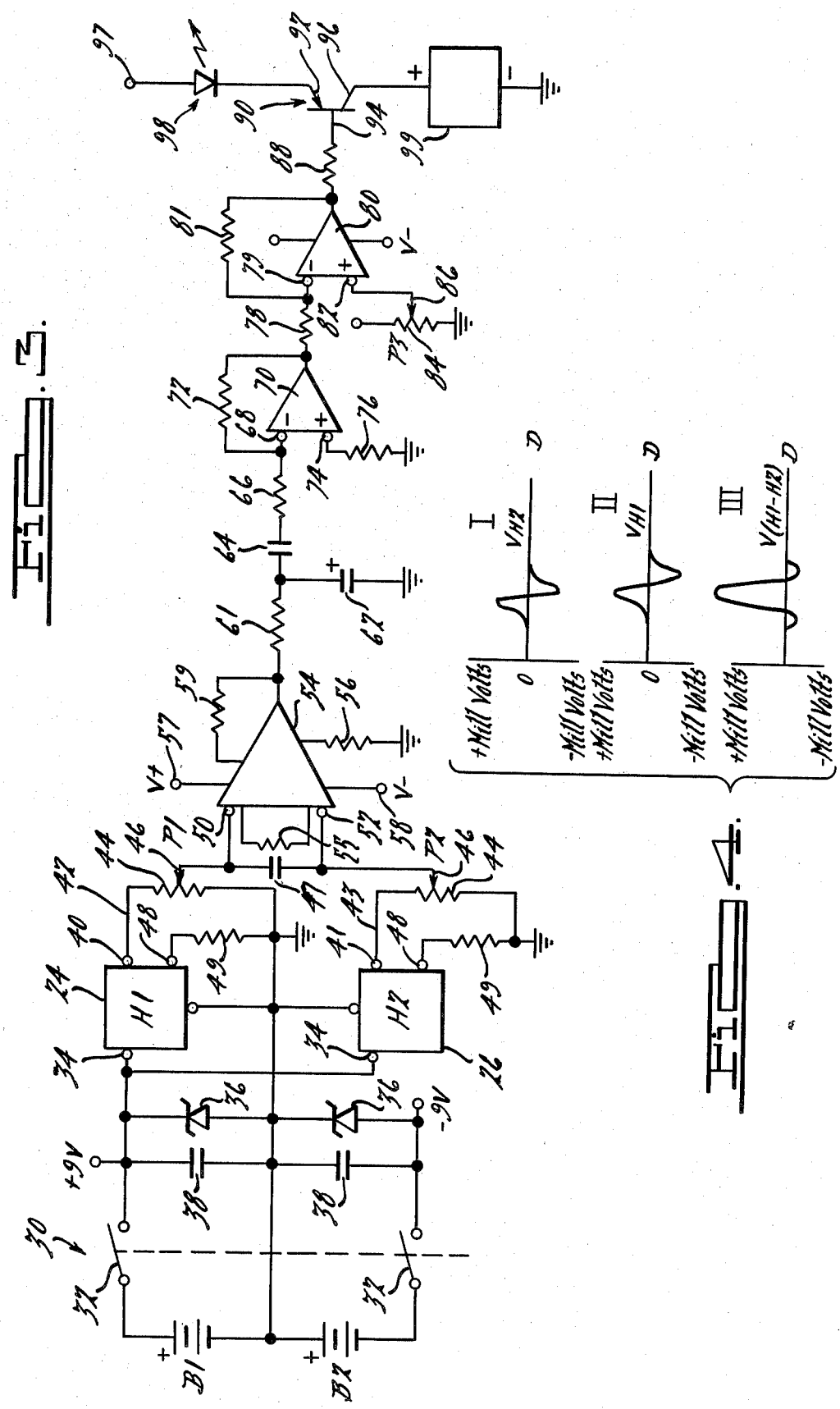

HALL EFFECT TESTER FOR HEATED WINDOW GRIDS

BACKGROUND AND SUMMARY OF THE INVENTION

This invention relates to electronic grid line continuity test devices and more particularly to an improved handheld Hall Effect Sensor sweep probe instrument designed for testing window grid heaters or the like. The invention has specific applications in testing automotive rear window electric defoggers having a series of parallel grid lines deposited on the inside surface of the glass. Heretofore electrical continuity testing of the grid lines required an inspector to work from within the vehicle and touch each individual grid line with a voltmeter lead with the other lead grounded. This time consumming procedure allows only random spot-check inspection of the heater grids during the vehicle production line assembly.

The present invention has as an object to provide a continuity test device for window glass electrical grids that does not require any direct electrical connection with the grid lines.

It is another object to provide electrical continuity inspection of interior surface vehicle window grid heaters by testing each bank of grid lines exterior of the vehicle with a hand-held pen-like module or probe by sweeping the probe over the window outer surface. A further object is to provide a grid line test probe that will detect low level grid line voltages by minimizing the instruments sensitivity to stray electronic waves prevalent in industrial sites.

The novel probe of the invention may, in a repair mode, be moved across individual grid lines to check for continuity. Indicating means are provided in the form of light emitting diodes, an audio alert signal or the like incorporated within the probe. The probe in another mode is initially passed over the outside glass surface in a single transverse sweep across a bank of grid lines to provide a go or no-go production line check. Current, supplied to the grid lines from the vehicle's battery source flows in each parallel grid line, thus generating separate localized magnetic fields or regions having a predetermined flux density.

A pair of side-by-side Hall Effect Sensors, positioned near a glide face of the probe, are spaced a predetermined distance less than the transverse spacing of the grid lines. The sensor active portions are directed toward the opposed outside surface of the glass. As the probe is moved across the glass outer surface transverse to the direction of the grid lines each sensor is alternately exposed to a maximum flux intensity region and a minimum flux intensity region created by the energized grid lines. The sensors are spaced relative to the grid lines such that when one sensor is exposed to a maximum flux density region the other sensor is exposed to a minimum flux density region. The offset output voltages of the sensors, in the form of out-of-phase sinusoidal wave forms, are fed to a pair of input pins of an instrumentation amplifier which amplifies the difference between the input voltages. The output of the instrumentation amplifier is a composit pulsed waveform signal. A low pass filter circuit removes any direct current component of the signal.

The probe circuit further amplifies and compares the signal with a reference voltage. When a pulse of significant magnitude is sensed by the circuit it triggers on an electronic valve which turns-on visual and/or acoustical signal means indicating to the operator each function grid line.

It is therefore a feature of the present invention to provide a handheld Hall Effect backlite pen instruement to readily detect breaks in vehicle window electric heater grid lines without requiring in-car inspection. These and other objects and features of the invention will appear from consideration of the preferred embodiments made with reference to the accompanying drawings.

BRIEF DESCRIPTION OF THE DRAWINGS

FIG. 3 is a schematic electric circuit diagram of the test instrument shown in FIG. 1; and FIG. 4 shows voltage waveforms on a distance base with reference to the circuit of FIG. 3.

DESCRIPTION OF THE PREFERRED EMBODIMENTS

Figures 1, 2:
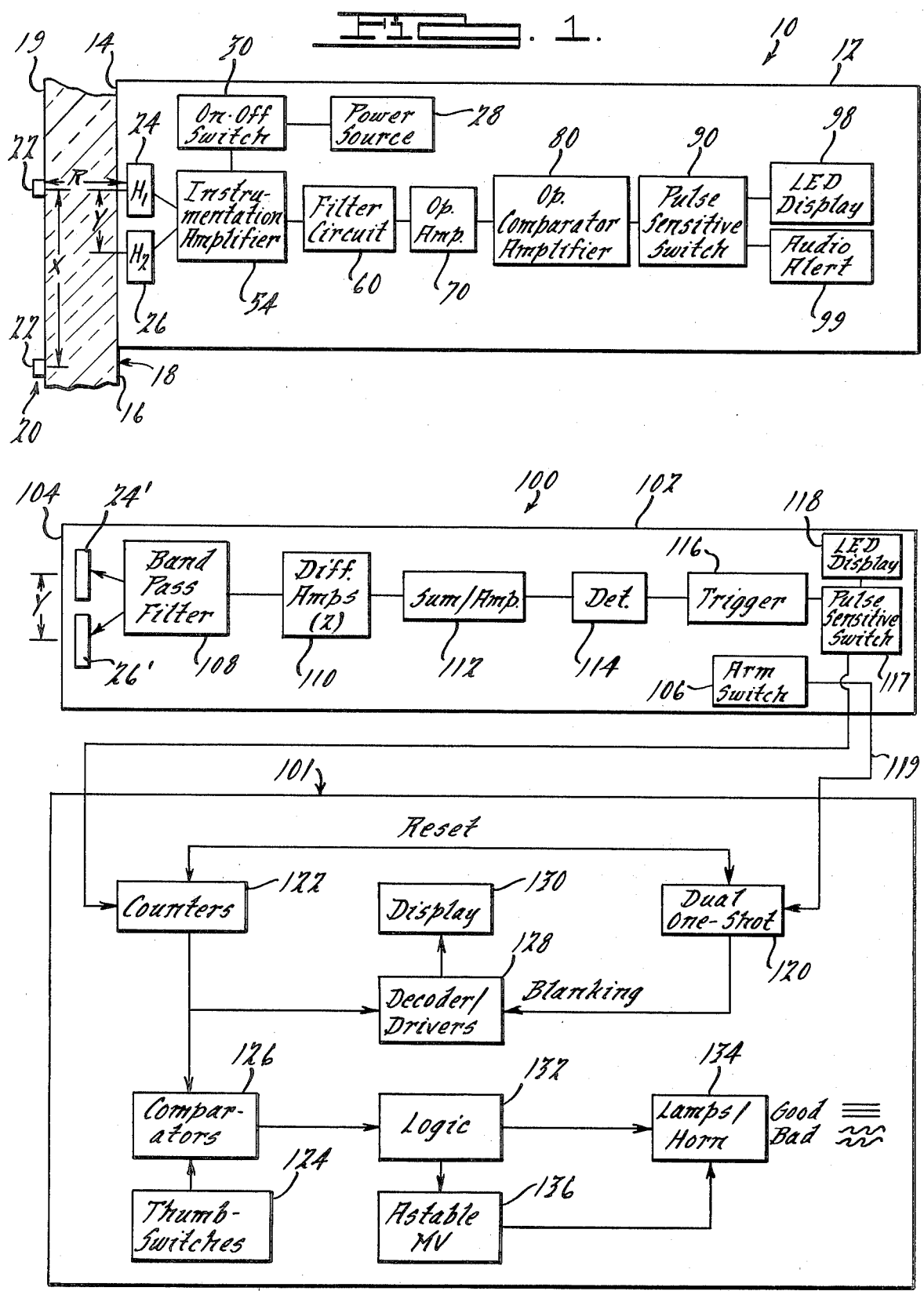
FIG. 1 is a diagramatic view and block diagram of a form of the test instrument of the present invention.
FIG. 2 is a view similar to FIG. 1 of an alternative form of the invention.

FIG. 1 illustrates a diagrammatic view of one embodiment of an electrically powered window heater grid test instrument or hand held probe generally indicated at 10. The probe handle includes a box-shaped probe housing 12 having an end wall 14 defining a frontal glide surface adapted for flush slidable engagement with one surface 16 of a glass-like pane or plate 18. The other side 19 of the glass plate has a conductive heater grid 20 operative in one form for defogging or de-icing a vehicle window glass.

In the disclosed system the conventional glass plate heater grid 20 comprises a series of horizontal grid lines 22 electrically connected with a pair of vertical bus bars (not shown) located on the inside surface of an automobile rear window glass. The electrically conductive lines 22 comprise an electrical parallel circuit. The grid lines are composed of a silver ceramic material which when baked on the inside surface 16 of the glass become bonded to the glass and are highly resistant to abrasion. It is possible, however, that a break may exist or occur in an individual grid line resulting in no current flow through the line.

See, for example, U.S. Pat. No. 4,065,848 to Dery issued Jan. 3, 1978 and incorporated by reference herein.

The present invention in one form is suited to readily detect breaks in the grid lines without the necessity of a direct positive test connection. As seen in FIG. 1 the grid lines 22 are alongated in a common first or horizontal direction and are transversely or vertically spaced from each other a predetermined uniform distance indicated by dimension "X".

The probe 10 has a pair of first and second Hall Effect Sensors 24 (H1) and 26 (H2) located in the vicinity of the probe frontal glide surface 14 and arranged on a first common axis oriented parallel to the plane of the glide surface 14. The Hall Sensors may be of the character referenced in U.S. Pat. No. 3,875,920 to Williams, for example, wherein the voltage developed across each Hall Effect Sensor is a measure of the field strength of the magnetic field that the sensor is in making the Hall Effect Sensors very good magnetic transducers. The sensors 24 and 26 are electrically insulated from one another and spaced side-by-side on their common axis a predetermined distance "Y" less than the spacing "X" between the parallel grid lines 22. By this arrangement the probe glide surface 14 is normally positioned in intimate flush contact against the outer surface 16 of the window glass 18 with the common axis of the sensors oriented substantially transverse to the grid lines elongated common first or horizontal direction.

The solid state circuit of FIG. 3, housed within the probe handle 10, includes the sensors 24 and 26 supplied from a power source 28 such as a pair of nine volt batteries B1 and B2. The probe includes on-off manual switch means, indicated at 30 in FIG. 1, in the form of a double pole-single throw initiation switch having movable poles 32. Closure of the switch poles 32 provides DC current to input terminals 34 of each of the Hall Effect Sensors 24 and 26. A pair of voltage regulating Zenner diodes 36 and capacitors 38 are connected to the battery terminals upon closure of the switch 30.

The output terminal pins 40 and 41 of the Hall Sensors 24 and 26 respectively, are each connected by output lines 42 and 43 to a pair of externally adjustable resistors 44 of first and second potentiometer devices P1 and P2. The potentiometers have movable switch blades 46, connected to capacitor 47, which may be adjusted providing means for nulling the offset voltage output signals of the Hall Sensors 24 and 26 during instrument calibration. Each of the Hall Sensors has its second output pin 48 grounded by resistors 49 wherein the sensors 24 and 26 are single output devices.

Each movable contact 46 of the potentimeters P1 and P2 is connected to input terminals 50 and 52 of amplifying means in the form of an instrumentation amplifier circuit 54. The instrumentation amplifier, incorporating a differential amplifier and an input resistor 55 is grounded through resistor 56 and is supplied from the DC power source at its positive and negative terminals 57 and 58.

The instrumentation amplifier 54 input terminals 50 and 52 receive the output voltage signal for each of the Hall Sensors 24 and 26 respectively generated as the probe glide surface 14 is moved on the window outer surface 19 in a direction transverse to the direction of the grid lines. As seen in FIG. 4 an output voltage in the form of sinusoidal waveform I is produced by the Hall Sensor 24 at pin 40 while an output voltage in the form of sinusoidal waveform II is produced by the Hall Sensor 26 at pin 41. It will be noted that as the probe is moved on the glass surface 19 across the grid lines Hall Sensor 26 is exposed alternatively to a positive flux density then to a negative flux density and so forth producing an information signal. The signal is represented in FIG. 4 with a distance base D transverse to the grid line. The instantaneous output voltage at pin 41 of sensor 26 is shown in waveform I of FIG. 4.

The spacing "Y" of the Hall Effect Sensors 24 and 26 is aout 1.2 cm for testing grid lines having a spacing "X" of about 2.4 cm. in the present embodiment. Because of the Hall Sensors spacing relative to the grid lines 22 moving sensor 26 is momentarily exposed to a negative or minimum flux density region intermediate the grid lines while moving sensor 24 is being momentarily exposed to a positive or maximum flux density region and so forth. In the instantaneous sweep position shown the sensor 24 is in direct opposed relation with the upper grid line 22 such that the distance R from the center of the grid line to the active face of the sensor 24 is about 0.62 cm. With a current through the upper grid line 22 of about 1.5 amps the grid line provides a minimum sensitivity of about 0.472 Gauss. Thus, the Hall Sensors during a full sweep of a car rear window grid 20 are instantaneously exposed to alternating maximum and minimum flux intensities.

The instrumentation amplifier 56, having a feedback resistor 59, includes a differential amplifier which amplifies the difference between the input voltage at pin 50 and the input voltage at pin 52. Potentiometers P1 and P2 provide a means of nulling the offset voltages of sensors 24 and 26 during calibration.

As seen in FIG. 1 the output of instrumentation amplifier 56 (Vout=($V_{H1}-V_{H2}$), shown by composit waveform III in FIG. 4, is fed to a filter circuit 60. The circuit 60 includes a resistor 61 and a capacitor 62 providing a band pass filter circuit which attenuates high-frequency noise from the output signal III. The output from the band pass filter is fed to the capacitor 64 which removes the direct current component from the signal and couples the signal via resistor 66 to negative terminal 68 a first operational amplifier 70. The operational amplifier 70 increases the signal by a gain of about 1000 by means of feedback resistor 72. The amplifier 70 having its positive terminal 74 grounded through resistor 76, squares-up the composite signal which is fed via resistor 78 to the negative input pin 79 of a second operational amplifier 80 having a feedback resistor 81. The positive input pin 82 of the operational amplifier 80 is connected to a grounded resistor 84 by movable contact 86 of a potentiometer P3. The amplifier 80 is configured as a voltage comparator with potentiometer P3 providing a reference voltage which may be adjusted to provide a negative signal output pulse. When a pulse of significant predetermined magnitude is sensed by comparator amplifier 80 its output, which pulses low, is fed through resistor 88 to turn on electronic valve means in the form of PNP transistor 90.

The low negative output pulses are fed from the amplifier 90 through the resistor 88 to the switching transistor 90 having emitter 92, base 94, and collector 96 electrodes of which the base electrode 94 is connected to the output of the operational amplifier 80. The emitter electrode 92 is connected to the supply voltage at terminal 97 through a light emitting diode 98. The collector electrode 96 of the transistor is connected to one positive side of an audio alert signalling device such as a buzzer 99 with the opposite negative side of the buzzer connected to ground.

In this manner by virtue of the control circuit described, visual and/or audio signals are activated by the control system upon receiving each triggering negative pulse from the output of the comparator amplifier 80 switching on the transistor 90. Thus, by means of the test probe 10 an operator by moving the glide surface 14 transverse to the common direction of the grid lines 22 a visual display or audio alert incorporated with the proble will indicate whether each successive grid line being passed over is conducting an electric current between the grid bus bars.

The following in a part list showing representation values for the circuit components of FIG. 3 for purposes of illustration and not in a limiting sense.

| Batteries | B1, B2 | 9 Volt |
|---|---|---|
| Hall Effect Sensors | 24, 26 | Micro-Switch 634552 linear magnetic sensors |
| Instrumentation Amp. | 54 | Burr Brown 3660K |
| Operational Amp. | 70, 80 | Dual Op. Amp. MC1458 |

| -continued | | |
|---|---|---|
| Audio Signal | 102 | Mallory Sonalert SC12 |
| Resistors | 49, 66, 76 | 10K, ¼ W RN550 |
| Resistors | 55, 78 | 1K, ¼ W RN550 |
| Resistors | 56, 59 | 50K, ¼ W RN550 |
| Resistor | 60 | 39.2K |
| Resistor | 72 | 10 MEG |
| Resistor | 81 | 2 MEG |
| Resistor | 88 | 2K |
| Potentiometer | P1, P2 | 10K Burns Trim Pot |
| Potentiometer | P3 | 20K Burns Trim Pot |
| Diodes | 36 | Zenner Diode, IN4739, 12.0 Volt |
| Capacitors | 38 | .01mf |
| Capacitor | 47 | .33mf |
| Capacitor | 62 | 4.7mf |
| Capacitor | 64 | 2.2mf |
| Transistor | 90 | 2N3906 |
| Diode | 100 | Light omitting diode LED |

Turning now to a modified form of invention shown in FIG. 2, a handle probe 100 and remote monitoring device 101 are generally indicated. A probe housing 102 encloses a control circuit for the instrument similar to the circuit of the FIG. 1 of proble handle 10. In the FIG. 2 form of the invention the housing 102 has a frontal end wall surface 104 for placement in intimate surface contacting relation with a glass panel such as the outer surface 16 of vehicle window 18.

The probe frontal end surface 104 has a pair of first and second Hall Effect sensors 24' and 26', identical to sensors 24 and 26, located adjacent thereto and spaced on their centers a distance "Y" in the same manner as the sensors of FIG. 1. The sensors are supplied from a suitable DC power source wired into the remote monitoring device 101. Closure of mode switch 106, such as by a manually depressable "arm" button provides power to the sensors 24' and 26' for a "scan" mode of operation. It will be noted that for using the probe 100 in trouble-shooting a window the mode switch 106 may be placed on "manual". In this setting the "arm" switch is not depressed and each individual grid line may be tested such that for a good line the LED display will flash.

The signal output from the sensors 24' and 26' is passed through a band-pass filter circuit 108 to the input of a differential amplifier circuit 110. The circuit 110 includes a pair of amplifiers which amplify the difference between the input voltage signals from the sensors as shown and described above.

The output signals are supplied to a summation amplifier circuit 112 whose output is similar to the waveform III of FIG. 4. The composit information signal is provided at the input of a detecting circuit 114 which amplifies the signal and detects its amplitude peaks for transmission to a circuit 116 which triggers a pulse sensitive switch circuit 117 such as a NPN transistor. A light emitting diode 118 is operative by the manual initiation of the mode on-off switch 106, to provide a visual display for each conducting grid line 22 in the manner of switch 30 of the FIG. 1 embodiment.

The probe housing 102 includes an "arm" switch circuit connected by a flexable line or cable 119 to the remote monitor housing dual one-shot monostable circuit 120 resetting a dual counter circuit 122. Manual switch means such as thumb-switches 124 are provided to enable the operator to dial-in the number of heater grid lines to a comparator circuit 126 corresponding to the window to be tested. During a scan of the grid lines the "arm" button is depressed and the probe is swept over all the grid lines with the probe surface 104 held in sliding contact with the glass surface 16. In the disclosed form a full sweep requires one to two seconds.

At the completion of the scan the "arm" button is released and the resulting signal will be transmitted to a decoder/driver circuit 128 and thence to readout display section 130. The section 130 is supplied with a reset signal at the beginning of each test sequence to reset the stored readout display section 130 of the monitor 101. The total number of active or conducting grid lines sensed will appear at and be stored by the readout and display section 130.

A logic circuit 132 also receives the scan signal. If the number of conducting grid lines sensed matches the number of lines selected by the thumb-switches 124 a suitable visual display will appear, such as a green light at circuit section 134. Also a steady audible tone may be provided by section 134. If there is a mismatch between the selected number of grid lines and the conducting grid lines sensed a visual display will appear and an interrupted tone will be heard at section 134 by means of an astable multi-vibrator circuit 136.

What is claimed is:

1. A solid state electrical continuity test probe instrument for detecting breaks in a plurality of electrically connected conductive resistive defroster grid lines located on a window glass plate installed in a motor vehicle, said grid lines elongated in a common first direction and uniformly transversely spaced from each other a predetermined first distance on the inside surface of the window glass plate area to be heated, a DC voltage source of the vehicle connected to said grid lines providing substantially equal currents passing through each grid line for heating the plate area, said instrument comprising:

a probe housing suitable for hand-held operation including a sensing frontal end having a substantially planar glide surface;

said housing including first and second Hall Effect sensors arranged on an axis parallel to said glide surface;

said sensors spaced on said axis with their centers located a predetermined second distance less than said predetermined first distance between the transversely spaced grid lines; said instrument characterized in that with said glide surface positioned in flush intimate contact with the outside surface of the vehicle window glass plate area and with said axis of the sensors oriented substantially transverse to the grid lines, said probe sensors adapted to be moved along the plate area in a direction transverse to said common first direction successively crossing each grid line;

whereby said first sensor is caused to alternately enter and depart maximum and minimum conducting grid line flux density regions while said second sensor is caused to concurrently enter and depart minimum and maximum conducting grid line flux density regions and so forth;

solid state detection circuit means within said housing supplied for a secondary DC power source, said circuit means operative for receiving and amplifying the phase difference in sinusoidal output voltage signals from said sensors to provide a composite sinusoidal output signal, and said circuit means including comparator means producing an output triggering pulse operative for successively activating and deactivating indicating means on said probe housing informing the operator of the state of electrical continuity of each successive grid line being traversed by said sensors, thereby obviating the need for the operator to enter the vehicle to conduct a continuity test of said grid lines with said probe instrument.

2. The test probe instrument as defined in claim 1, wherein said probe instrument includes a remote monitoring device, said probe housing including a manual mode switch connected by flexible cable means to said remote monitoring device, said mode switch operative in one position to provide a "scan" mode wherein said probe instrument glide surface is operative to be swept over all the grid lines on the glass plate area outer surface in a time frame of the order of one to two seconds; and said mode switch operative in another position to provide a "manual" mode wherein each individual grid line may be tested separately for continuity.

3. The test probe instrument as defined in claim 1, wherein said probe instrument indicating means being in the form of visual and/or audio alert means in the probe housing indicating to the operator the continuity of each grid line being tested.

* * * * *